(12) United States Patent
Peng et al.

(10) Patent No.: US 11,948,974 B2
(45) Date of Patent: Apr. 2, 2024

(54) SEMICONDUCTOR DEVICE INCLUDING VERTICAL TRANSISTOR WITH BACK SIDE POWER STRUCTURE

(71) Applicant: Taiwan Semiconductor Manufacturing Co., Ltd., Hsin-Chu (TW)

(72) Inventors: Shih-Wei Peng, Hsinchu (TW); Te-Hsin Chiu, Hsinchu (TW); Jiann-Tyng Tzeng, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 116 days.

(21) Appl. No.: 17/461,476

(22) Filed: Aug. 30, 2021

(65) Prior Publication Data
US 2023/0069119 A1     Mar. 2, 2023

(51) Int. Cl.
| | |
|---|---|
| *H01L 29/06* | (2006.01) |
| *H01L 23/522* | (2006.01) |
| *H01L 25/11* | (2006.01) |
| *H01L 29/423* | (2006.01) |
| *H01L 29/786* | (2006.01) |

(52) U.S. Cl.
CPC ...... *H01L 29/0673* (2013.01); *H01L 23/5226* (2013.01); *H01L 25/115* (2013.01); *H01L 29/0649* (2013.01); *H01L 29/42392* (2013.01); *H01L 29/78618* (2013.01)

(58) Field of Classification Search
CPC ........... H01L 29/0649; H01L 29/42392; H01L 29/0673; H01L 23/5226; H01L 25/115; H01L 21/823475; H01L 21/823871
See application file for complete search history.

(56) References Cited

U.S. PATENT DOCUMENTS

| | | | |
|---|---|---|---|
| 2020/0135735 A1* | 4/2020 | Sengupta | H01L 29/78696 |
| 2022/0102492 A1* | 3/2022 | Gardner | H01L 21/823842 |
| 2022/0254925 A1* | 8/2022 | Gardner | H01L 29/42392 |
| 2022/0293523 A1* | 9/2022 | Gardner | H01L 21/823475 |
| 2022/0293789 A1* | 9/2022 | Fulford | H01L 27/0688 |

* cited by examiner

*Primary Examiner* — Dao H Nguyen
(74) *Attorney, Agent, or Firm* — Duane Morris LLP

(57) ABSTRACT

A semiconductor device including vertical transistors with a back side power structure, and methods of making the same are described. In one example, a described semiconductor structure includes: a gate structure including a gate pad and a gate contact on the gate pad; a first source region disposed below the gate pad; a first drain region disposed on the gate pad, wherein the first source region, the first drain region and the gate structure form a first transistor; a second source region disposed below the gate pad; a second drain region disposed on the gate pad, wherein the second source region, the second drain region and the gate structure form a second transistor; and at least one metal line that is below the first source region and the second source region, and is electrically connected to at least one power supply.

20 Claims, 18 Drawing Sheets ature, in accordance with some embodiments of the present disclosure.

SEMICONDUCTOR DEVICE INCLUDING VERTICAL TRANSISTOR WITH BACK SIDE POWER STRUCTURE

BACKGROUND

As the semiconductor industry has progressed into nanometer technology nodes in pursuit of higher device density, higher performance, and lower costs, challenges from both fabrication and design issues have resulted in the development of three-dimensional designs, such as a gate-all-around (GAA) transistor. A typical GAA transistor, e.g. a GAA nanowire channel field-effect transistor (FET), enables enhanced control of the charge carriers along the lengthwise direction through a complete encirclement of the channel region of a semiconductor nanowire by a gate dielectric and a gate electrode. The GAA transistor has a reduced short channel effect, because the channel region may be surrounded by the gate electrode so that an effect of the source/drain region on an electric field of the channel region may be reduced.

Although various integrated circuits with the nanowire FETs have been proposed, technological advances in structure design of integrated circuits with the nanowire FETs are required to overcome various difficulties, because requirements in providing the integrated circuits with advanced performances are becoming more challenging. As such, improvements in integrated circuits and methods of fabricating thereof continue to be sought.

The information disclosed in this Background section is intended only to provide context for various embodiments of the invention described below and, therefore, this Background section may include information that is not necessarily prior art information (i.e., information that is already known to a person of ordinary skill in the art). Thus, work of the presently named inventors, to the extent the work is described in this background section, as well as aspects of the description that may not otherwise qualify as prior art at the time of filing, are neither expressly nor impliedly admitted as prior art against the present disclosure.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION OF EXEMPLARY EMBODIMENTS

Figure 1:
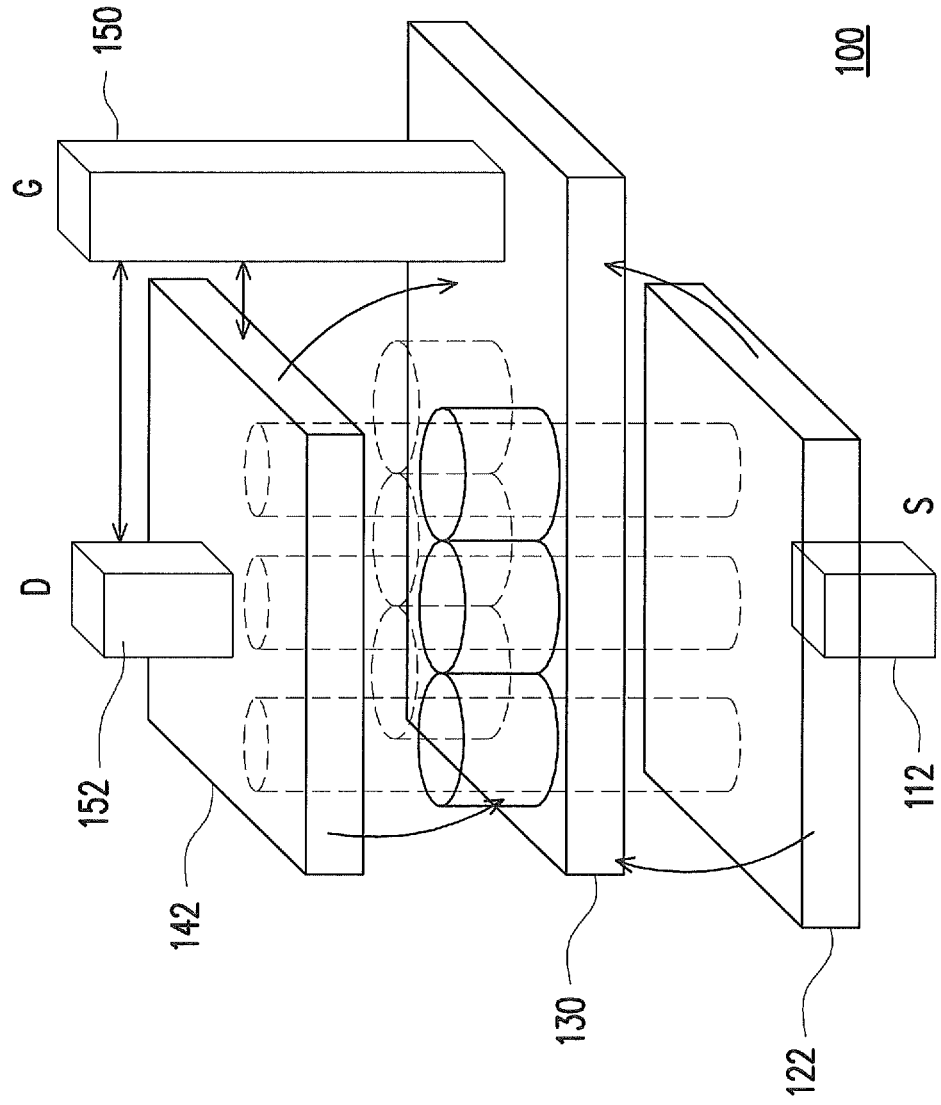
FIG. 1 illustrates a perspective view of an exemplary vertical transistor, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

In order to reduce the substrate area occupied by a transistor and improve routing flexibility, the present teaching discloses a vertical nanowire transistor with back side power structure. In some embodiments, a signal current in the vertical nanowire transistor flows through a plurality of vertical nanowires disposed between a source pad and a drain pad that are stacked vertically. The plurality of vertical nanowires is the vertical semiconductor channel between the source and the drain, and is controlled by a voltage on a gate pad, which is between the source pad and the drain pad and surrounds each of the plurality of vertical nanowires. One or more metal lines are disposed below the source pad to provide power supply to the vertical nanowire transistor, through one or more vias at the back side of the vertical nanowire transistor. The vertical structure reduces parasitic capacitance of the transistor, and provides a better ratio between width and height of a unit cell, which includes two transistors sharing a same gate pad.

In some embodiments, a connection structure is disclosed to connect two respective transistors of two adjacent unit cells in series. In one embodiment, the connection structure comprises a via physically coupled between a drain pad of one of the two adjacent cells and a source pad of the other one of the two adjacent cells. In another embodiment, the connection structure comprises an inner metal electrically connected between a drain pad of one of the two adjacent cells and a source pad of the other one of the two adjacent cells, through two vias on and below the inner metal respectively. In yet another embodiment, the connection structure comprises a common drain pad shared by the two adjacent cells, and a via physically coupled between a source pad of one of the two adjacent cells and a metal line at a front side of the cell.

FIG. 1 illustrates a perspective view of an exemplary vertical transistor 100, in accordance with some embodiments of the present disclosure. As shown in FIG. 1, the exemplary vertical transistor 100 includes a gate pad 130 sandwiched between a source pad 122 below the gate pad 130 and a drain pad 142 over the gate pad 130. While a drain contact 152 is disposed on the drain pad 142 to provide routing connection to front side of the vertical transistor 100, a source contact 112 is disposed below the source pad 122 to provide routing connection to back side of the vertical transistor 100. Compared to a transistor with all front side routing, the vertical transistor 100 with back side routing has a smaller area of the source contact 112, which reduces the capacitance between the source pad 122 and the gate pad 130. In addition, because the source contact 112 is disposed below the source pad 122 in the vertical transistor 100 for back side routing, parasitic capacitances generated between the source contact 112 and any one of the drain contact 152, the drain pad 142 and the gate pad 130 can be reduced or removed, compared to a transistor with all front side routing.

Figure 2A:
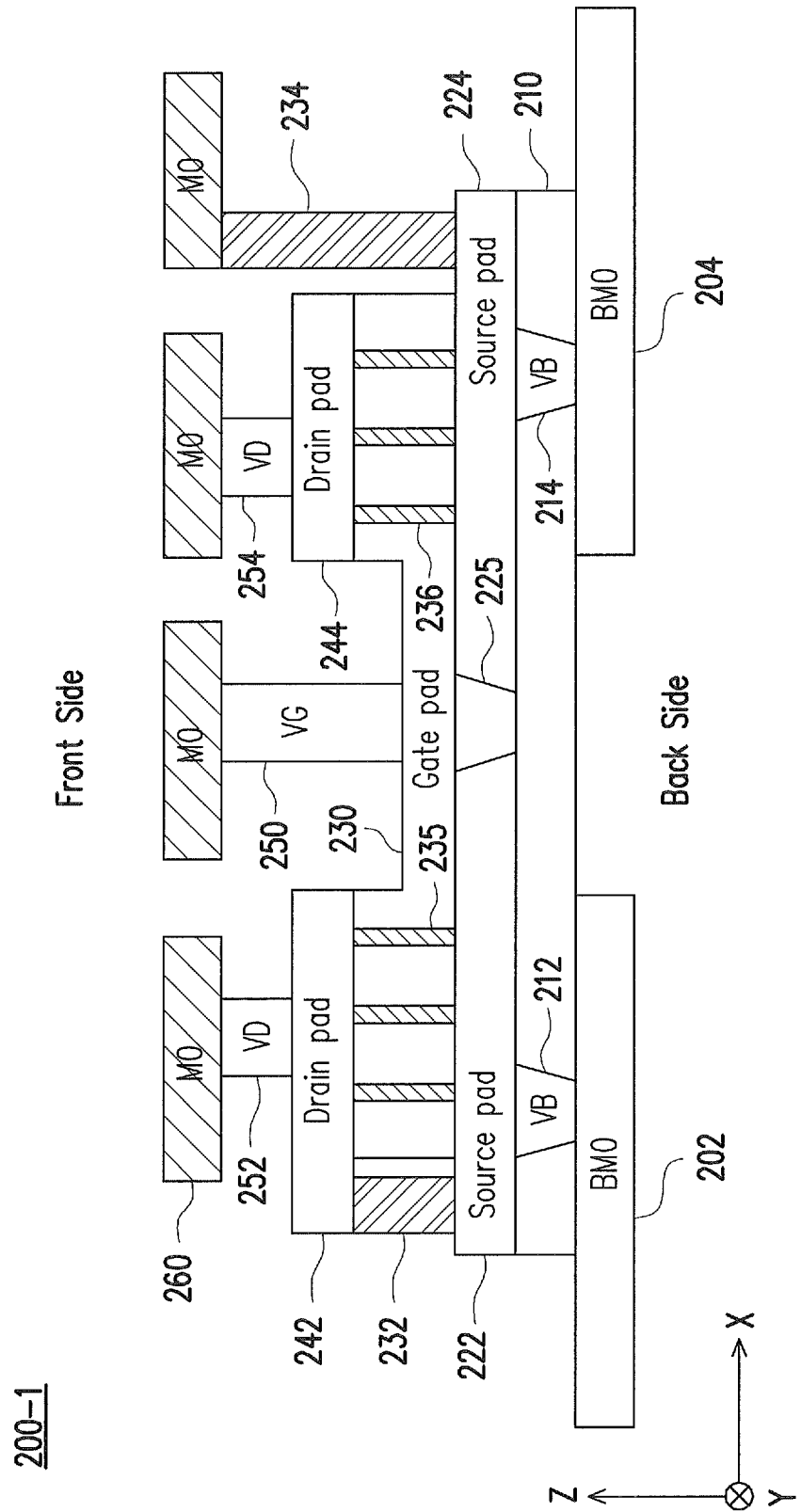
FIG. 2A illustrates a cross sectional view of an exemplary semiconductor structure, in accordance with some embodiments of the present disclosure.

FIG. 2A illustrates a cross sectional view of an exemplary semiconductor structure 200-1, in accordance with some embodiments of the present disclosure. As shown in FIG. 2A, the semiconductor structure 200-1 includes a gate structure including a gate pad 230 and a gate contact 250 on the gate pad 230. The semiconductor structure 200-1 includes a first source region disposed below the gate pad 230; and a first drain region disposed on the gate pad 230. The first source region includes a first source pad 222 and a first source contact 212 below the first source pad 222. The first drain region includes a first drain pad 242 and a first drain contact 252 on the first drain pad 242.

The semiconductor structure 200-1 further includes a second source region disposed below the gate pad 230; and a second drain region disposed on the gate pad 230. The second source region includes a second source pad 224 and a second source contact 214 below the second source pad 224. The second drain region includes a second drain pad 244 and a second drain contact 254 on the second drain pad 244.

In some embodiments, each of the first source pad 222, the second source pad 224, the first drain pad 242, the second drain pad 244 and the gate pad 230 may be formed using any suitable formation process and then patterned using a photolithography/etching process or another suitable material removal process. In some embodiments, each of the first source pad 222, the second source pad 224, the first drain pad 242, the second drain pad 244 and the gate pad 230 may include: metal, metal compound, silicide or a combination thereof. In some embodiments, the metal or metal compound includes Ti, Ta, W, Al, Cu, Mo, Pt, TiN, TaN, TaC, TaSiN, WN, MoN, MoON, RuO$_2$, TiAl, TiAlN, TaCN, a combination thereof or another suitable material. In some embodiments, the silicide includes cobalt silicide, titanium silicide, tungsten silicide, nickel silicide or a combination thereof.

In some embodiments, each of the first drain contact 252 and the second drain contact 254 is called a via at the drain (VD); and each of the first source contact 212 and the second source contact 214 is called a via at the back (VB); and the gate contact 250 is called a via at the gate (VG). In some embodiments, each of the first drain contact 252, the second drain contact 254, the first source contact 212, the second source contact 214 and the gate contact 250 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped polycrystalline silicon, other conductive materials, combinations thereof, or the like.

The first source region, the first drain region and the gate structure form a first transistor, while the second source region, the second drain region and the gate structure form a second transistor. The two transistors share a same gate 230 electrically connected to a metal 0 line 260 over the gate pad 230 by a contact or via VG 250. In some embodiments, the first transistor is a metal-oxide-semiconductor field-effect transistor (MOSFET) of a first type; and the second transistor is a MOSFET of a second type, where the first type and the second type are opposite types. For example, the first transistor is a p-type transistor and the second transistor is an n-type transistor; or the first transistor is an n-type transistor and the second transistor is a p-type transistor.

In FIG. 2A, the upper side along the Z direction of the semiconductor structure 200-1 is referred to as a front side of the semiconductor structure 200-1, while the lower side along the Z direction of the semiconductor structure 200-1 is referred to as a back side of the semiconductor structure 200-1. The front side and the back side are opposite sides. As shown in FIG. 2A, the semiconductor structure 200-1 further includes metal 0 (M0) lines 260 disposed over the gate structure, i.e. at the front side of the semiconductor structure 200-1. Each of the gate contact 250, the first drain contact 252 and the second drain contact 254, is electrically connected to one of the M0 metal lines 260 disposed over the gate structure. The semiconductor structure 200-1 also includes bottom metal 0 (BM0) lines 202, 204 disposed below the gate structure, i.e. at the back side of the semiconductor structure 200-1. The first source contact 212 is electrically connected to the BM0 metal line 202 at the back side of the semiconductor structure 200-1. The second source contact 214 is electrically connected to the BM0 metal line 204 at the back side of the semiconductor structure 200-1.

In some embodiments, at least one of the BM0 metal lines 202, 204 is electrically connected to a power supply. For example, the first source contact 212 is electrically connected to a positive power supply (VDD) through the BM0 metal line 202 at the back side of the semiconductor structure 200-1; and the second source contact 214 is electrically connected to a negative power supply (VSS) through the BM0 metal line 204 at the back side of the semiconductor structure 200-1. Alternatively, the first source contact 212 is electrically connected to a negative power supply (VSS) through the BM0 metal line 202 at the back side of the semiconductor structure 200-1; and the second source contact 214 is electrically connected to a positive power supply (VDD) through the BM0 metal line 204 at the back side of the semiconductor structure 200-1.

The M0 metal lines 260 are closest metal lines to the two transistors along the Z direction at the front side, while the BM0 metal lines 202, 204 are closest metal lines to the two transistors along the Z direction at the back side. In some embodiments, as shown in FIG. 2A, the BM0 metal lines 202, 204 at the back side are formed in parallel with the M0 metal lines 260 at the front side. In other embodiments, the BM0 metal lines 202, 204 at the back side are formed perpendicular to the M0 metal lines 260 at the front side.

As shown in FIG. 2A, the semiconductor structure 200-1 further includes a plurality of first vias 235 formed through the gate pad 230 and connecting the first drain pad 242 with the first source pad 222; and includes a plurality of second vias 236 formed through the gate pad 230 and connecting the second drain pad 244 with the second source pad 224. In some embodiments, the plurality of first vias 235 form a vertical nanowire channel 235 between the first source pad 222 and the first drain pad 242; while the plurality of second vias 236 form a vertical nanowire channel 236 between the second source pad 224 and the second drain pad 244. Each of the channel 235 and the channel 236 is controlled by a voltage on the gate pad 230. In some embodiments, the vertical nanowire channel 235 and the vertical nanowire channel 236 include semiconductor material of opposite types. For example, the vertical nanowire channel 235 is a p-type channel including a p-type semiconductor material, and the vertical nanowire channel 236 is an n-type channel including an n-type semiconductor material. Alternatively, the vertical nanowire channel 236 is a p-type channel including a p-type semiconductor material, and the vertical nanowire channel 235 is an n-type channel including an n-type semiconductor material. A transistor with a nanowire channel can have superior electrostatics to those of a conventional transistor. The fabrication of nanowire channel may include generating a collection of nanowires and placing them where desired (e.g., a bottom-up approach) or may include various lithographic patterning procedures (e.g., a top-down approach).

As shown in FIG. 2A, the first source contact 212 and the second source contact 214 are formed in a dielectric layer 210. In some embodiments, the dielectric layer 210 includes a dielectric material such as silicon oxide, silicon nitride, silicon oxynitride, high-k material (e.g., hafnium oxide (HfOx), zirconium oxide (ZrOx) or aluminum oxide ($Al_2O_3$)) or another suitable insulating material. The dielectric layer 210 is formed on a metal layer including the BM0 metal lines 202, 204. The first source pad 222 and the second source pad 224 are formed in a source pad layer on the dielectric layer 210. The source pad layer includes a shallow trench isolation (STI) 225 between the first source pad 222 and the second source pad 224, where the STI electrically isolates the first source pad 222 and the second source pad 224.

In some embodiments, the semiconductor structure 200-1 in FIG. 2A may also include a via 232 connecting a source pad and a drain pad, e.g. connecting the first source pad 222 and the first drain pad 242, where the via 232 is located outside the gate pad 230. In some embodiments, the semiconductor structure 200-1 in FIG. 2A may also include a via 234 connecting a source pad, e.g. the second source pad 224, to a M0 metal line 260 at the front side, where the via 234 is located outside the gate pad 230.

In some embodiments, each of the vertical nanowires or nano-sheets 235, 236 has a height NSH along the Z direction between 12.5 nanometers and 60 nanometers. In some embodiments, each of the first drain contact 252 and the second drain contact 254 has a height (VD_H) along the Z direction between 0.5*NSH and 2.5*NSH. In some embodiments, each of the first source contact 212 and the second source contact 214 (VB_H) has a height along the Z direction between 0.5*NSH and 2.5*NSH. In some embodiments, each of the first source pad 222 and the second source pad 224 has a height (Source_Pad_H) along the Z direction between 1*NSH and 2*NSH. In some embodiments, each of the first drain pad 242 and the second drain pad 244 has a height (Drain_Pad_H) along the Z direction between 1*NSH and 3*NSH. In some embodiments, the via 232 has a height along the Z direction equal to NSH. In some embodiments, the gate contact 250 has a height (VG_H) along the Z direction as VG_H=VD_H+Drain_Pad_H+a*NSH, wherein a is between 0.7 and 1.

Figure 2B:
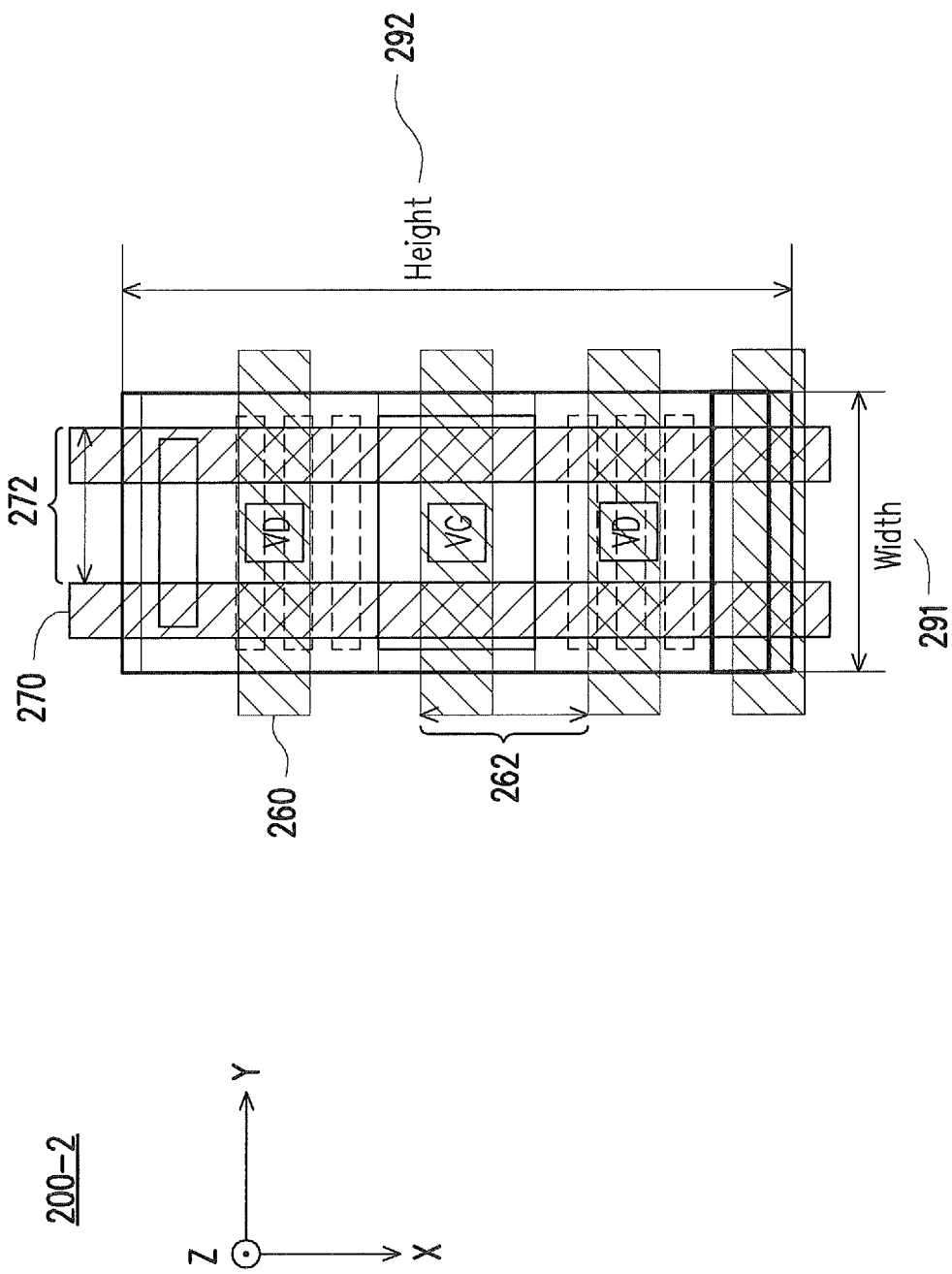
FIG. 2B illustrates a top view of a front side of an exemplary semiconductor structure, in accordance with some embodiments of the present disclosure.

FIG. 2B illustrates a top view of a front side of an exemplary semiconductor structure 200-2, corresponding to the semiconductor structure 200-1 in FIG. 2A, in accordance with some embodiments of the present disclosure. In some embodiments, the semiconductor structure 200-2 including two transistors sharing a gate pad as shown in FIG. 2A and FIG. 2B may be called a unit cell, which serves as a basic unit for a semiconductor device. For example, various semiconductor devices, e.g. inverter, AND gate, NAND gate, OR gate, etc., may be formed by one or more unit cells.

As shown in FIG. 2B, a unit cell may include a plurality of metal layers 260, 270 on top of the transistors. In some embodiments, the first metal layer 260 includes a plurality of metal 0 lines 260 formed on the gate contact 250, the first drain contact 252 and the second drain contact 254; and the second metal layer 270 includes a plurality of metal 1 lines 270 formed on the first metal layer 260. While each of the plurality of metal 0 lines 260 extends along the Y direction, each of the plurality of metal 1 lines 270 extends along the X direction perpendicular to the Y direction.

As shown in FIG. 2B, a unit cell 200-2 has a first length (called "width") 291 along the Y direction and a second length (called "height") 292 along the X direction. In some embodiments, a distance from a metal 0 line to an adjacent metal 0 line is called a first metal pitch 262 of the first metal layer 260; while a distance from a metal 1 line to an adjacent metal 1 line is called a second metal pitch 272 of the second metal layer 270.

Figure 3A:
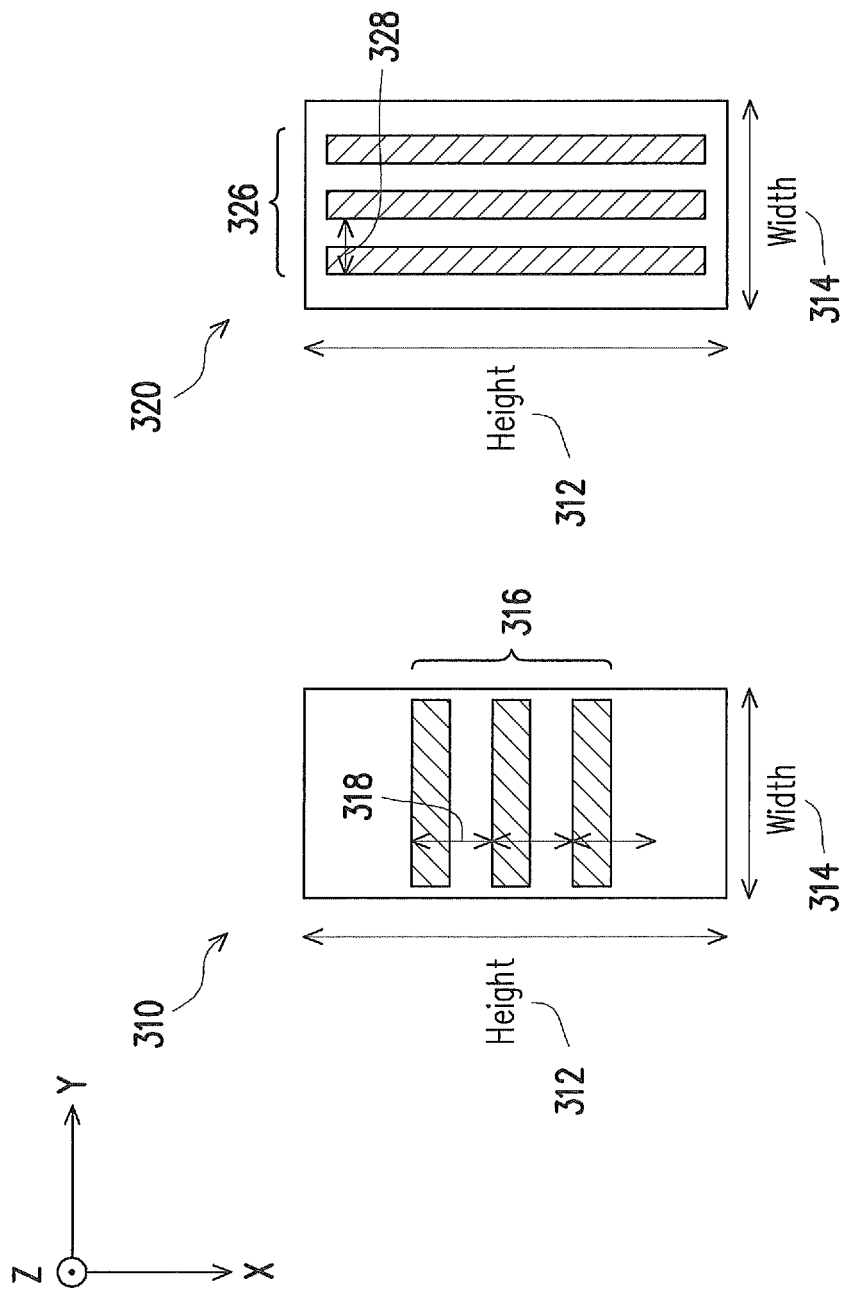
FIG. 3A illustrates an exemplary layout of metal lines at a front side of an exemplary semiconductor structure, in accordance with some embodiments of the present disclosure.

FIG. 3A illustrates an exemplary layout of metal lines at a front side of an exemplary semiconductor structure, e.g. a unit cell as shown in FIG. 2A and FIG. 2B, in accordance with some embodiments of the present disclosure. In this example, the unit cell includes a first metal layer 310 including metal lines 316 extending along the Y direction on the transistors of the unit cell at the front side; and includes a second metal layer 320 including metal lines 326 extending along the X direction on the first metal layer 310. In some embodiments, the unit cell in FIG. 3A has at least three metal lines 316 in the first metal layer 310, where one of the metal lines 316 is for routing the gate of the cell and two of the metal lines 316 are for routing the two drains respectively of the cell. In some embodiments, the unit cell in FIG. 3A has at least two metal lines 326 in the second metal layer 320, where one of the metal lines 326 is for routing the gate of the cell and one of the metal lines 326 is for routing the two drains of the cell. In some embodiments, the unit cell in FIG. 3A has a height 312 within a range between 3 times a first metal pitch 318 and 5.5 times the first metal pitch 318 of the first metal layer 310; and has a width 314 within a range between 2 times a second metal pitch 328 and 3 times the second metal pitch 328 of the second metal layer 320. In some embodiments, the first metal pitch 318 and the second metal pitch 328 has a ratio of 20/26.

Figure 3B:
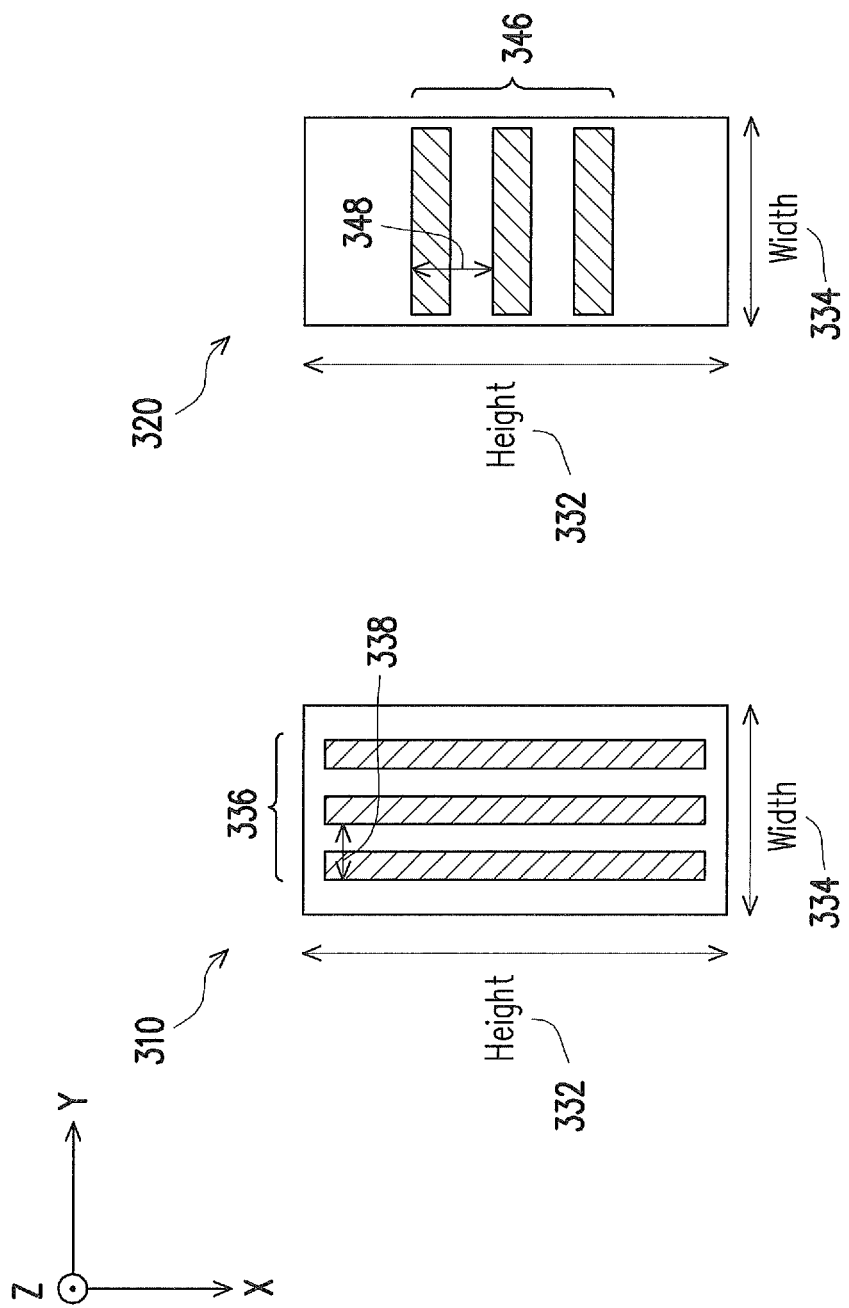
FIG. 3B illustrates another exemplary layout of metal lines at a front side of an exemplary semiconductor structure, in accordance with some embodiments of the present disclosure.

FIG. 3B illustrates another exemplary layout of metal lines at a front side of an exemplary semiconductor structure or unit cell, in accordance with some embodiments of the present disclosure. In this example, the unit cell in FIG. 3B includes a first metal layer 330 including metal lines 336 extending along the X direction on the transistors of the unit cell at the front side; and includes a second metal layer 340 including metal lines 346 extending along the Y direction on the first metal layer 330. In some embodiments, the unit cell in FIG. 3B has at least two metal lines 336 in the first metal layer 330, where one of the metal lines 336 is for routing the gate of the cell and one of the metal lines 336 is for routing the two drains of the cell. In some embodiments, the unit cell in FIG. 3B has at least three metal lines 346 in the second metal layer 340, where one of the metal lines 346 is for routing the gate of the cell and two of the metal lines 346 are for respectively routing the two drains of the cell. In some embodiments, the unit cell in FIG. 3B has a height 332 within a range between 2 times a first metal pitch 338 and 3 times the first metal pitch 338 of the first metal layer 330; and has a width 334 within a range between 3 times a second metal pitch 348 and 5 times the second metal pitch 348 of the second metal layer 340. In some embodiments, an area impact of a cell as shown in FIGS. 1-3 can be reduced due to: the ratios between the disclosed height and width of the cell, and/or the ratios between the disclosed first metal pitch and second metal pitch.

Figure 4A:
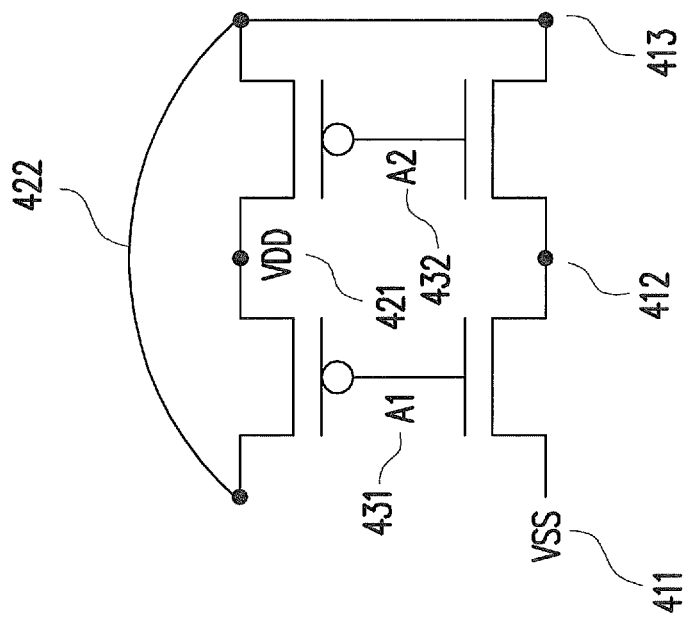
FIG. 4A illustrates an exemplary circuit including two unit cells, in accordance with some embodiments of the present disclosure.
Figure 4B:
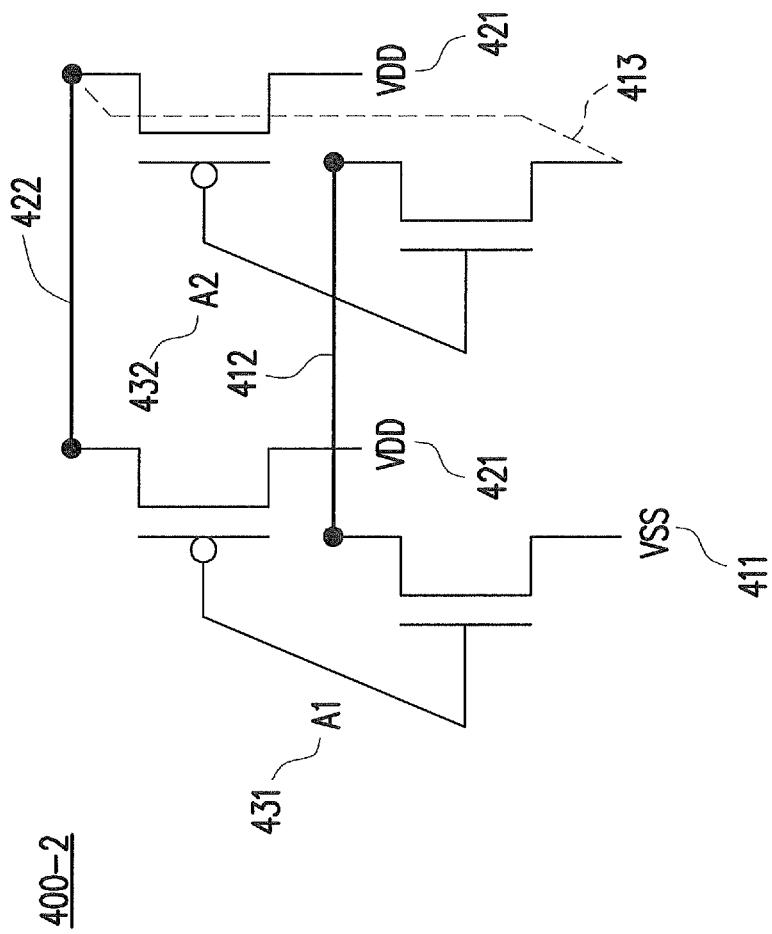
FIG. 4B illustrates a perspective view of an exemplary circuit including two unit cells, in accordance with some embodiments of the present disclosure.

FIG. 4A shows a diagram of an exemplary circuit 400-1 including two unit cells, in accordance with some embodiments of the present disclosure. FIG. 4B illustrates a perspective view of an exemplary circuit 400-2 including two unit cells, corresponding to the diagram in FIG. 4A in accordance with some embodiments of the present disclosure. The nodes/connections 411, 412, 413, 421, 422, 431, 432 in FIG. 4B correspond to the nodes/connections 411, 412, 413, 421, 422, 431, 432 in FIG. 4A. In some embodiments, the exemplary circuit 400-2 in FIG. 4B is a two-input NAND, which has power supplies (VDD 421 and VSS 411) at the back side. To implement the two-input NAND 400-2, two connections 412, 422 are formed at the front side of the circuit, while one connection 413 is formed to pass signal between the front side and the back side of the circuit. As such, in the example shown in FIG. 4A and FIG. 4B, at least one connection structure is needed to electrically connect a source at the back side of a transistor to a drain at the front side of another transistor, i.e. connecting the two transistors in series.

Figure 5:
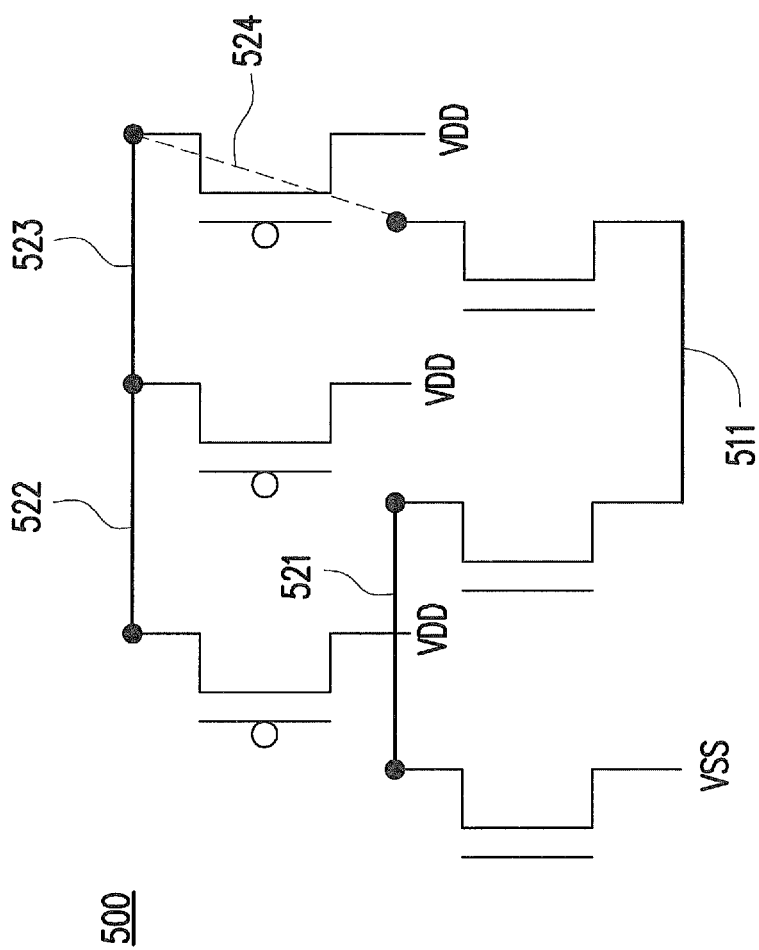
FIG. 5 illustrates a perspective view of an exemplary circuit including three unit cells, in accordance with some embodiments of the present disclosure.

FIG. 5 illustrates a perspective view of an exemplary circuit 500 including three unit cells, in accordance with some embodiments of the present disclosure. In some embodiments, the exemplary circuit 500 in FIG. 5 is a three-input NAND, which has power supplies (VDD, VSS) at the back side. To implement the three-input NAND 500, four connections 521, 522, 523, 524 are formed at the front side of the circuit, while one connection 511 is formed at the back side of the circuit. As such, in the example shown in FIG. 5, no connection structure is needed to pass signal between the front side and the back side of the circuit.

Figure 6A:
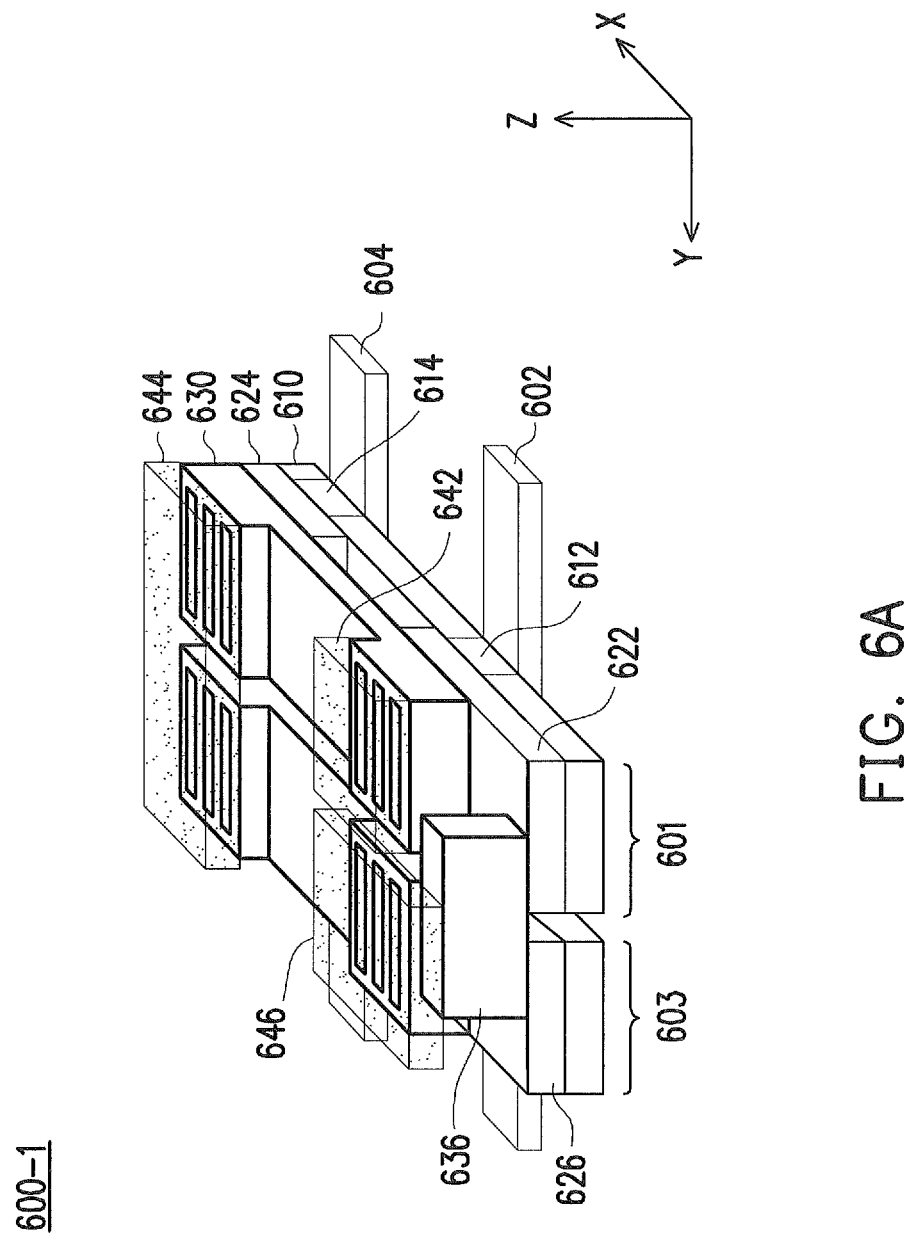
FIG. 6A illustrates a perspective view of two adjacent unit cells with a connection structure, in accordance with some embodiments of the present disclosure.

FIG. 6A illustrates a perspective view of a device 600-1 including two adjacent unit cells with a connection structure, in accordance with some embodiments of the present disclosure. As shown in FIG. 6A, the device 600-1 includes two adjacent unit cells 601, 603 formed on metal lines 602, 604 at the back side of the device 600-1. The unit cell 601 includes: source pads 622, 624 formed on a dielectric layer 610; a gate pad 630 on the source pads 622, 624; and drain pads 642, 644 formed on the gate pad 630. While the unit cell 603 has a similar structure to that of the unit cell 601, both the unit cell 601 and the unit cell 603 are provided with power supplies via the metal lines 602, 604 at the back side. For example, the unit cell 601 and the unit cell 603 are provided with a negative power supply (VSS) from the metal line 602 at the back side through a via 612 in the dielectric layer 610; and provided with a positive power supply (VDD) from the metal line 604 at the back side through a via 614 in the dielectric layer 610. Alternatively, the unit cell 601 and the unit cell 603 are provided with a negative power supply (VSS) from the metal line 604 at the back side through the via 614 in the dielectric layer 610; and provided with a positive power supply (VDD) from the metal line 602 at the back side through the via 612 in the dielectric layer 610.

As shown in FIG. 6A, the device 600-1 further includes a via 636 physically coupled between the drain pad 646 of the unit cell 603 and the source pad 622 of the unit cell 601.

Figure 6B:
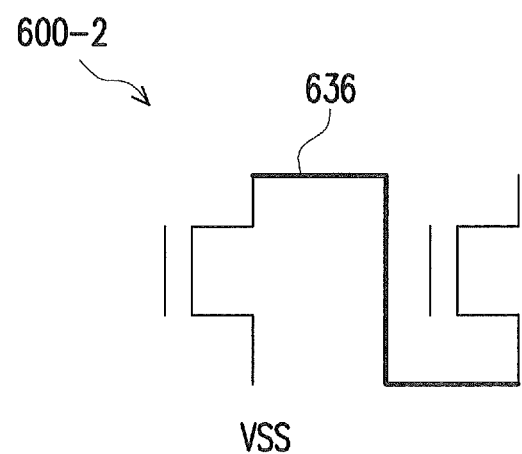
FIG. 6B illustrates a circuit diagram and a top view of the connection structure in FIG. 6A, in accordance with some embodiments of the present disclosure.
Figure 6B:
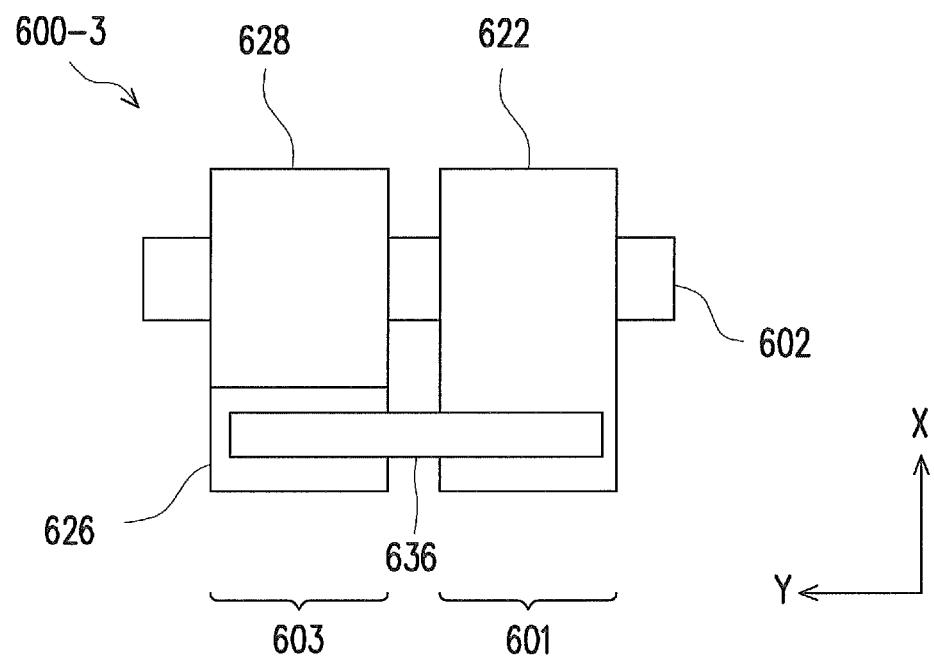

This via 636 connects two transistors of the two adjacent unit cells 601, 603 respectively in series, as illustrated in a circuit diagram 600-2 of FIG. 6B corresponding to the connection structure 636 in FIG. 6A. While the via 636 is located on the source pad 622 in the unit cell 601, the via 636 is located on a dielectric portion 626 in the unit cell 603. As shown in a top view 600-3 of the connection structure 636 in FIG. 6B, the dielectric portion 626 is beside the source pad 628 in the unit cell 603.

Figure 7A:
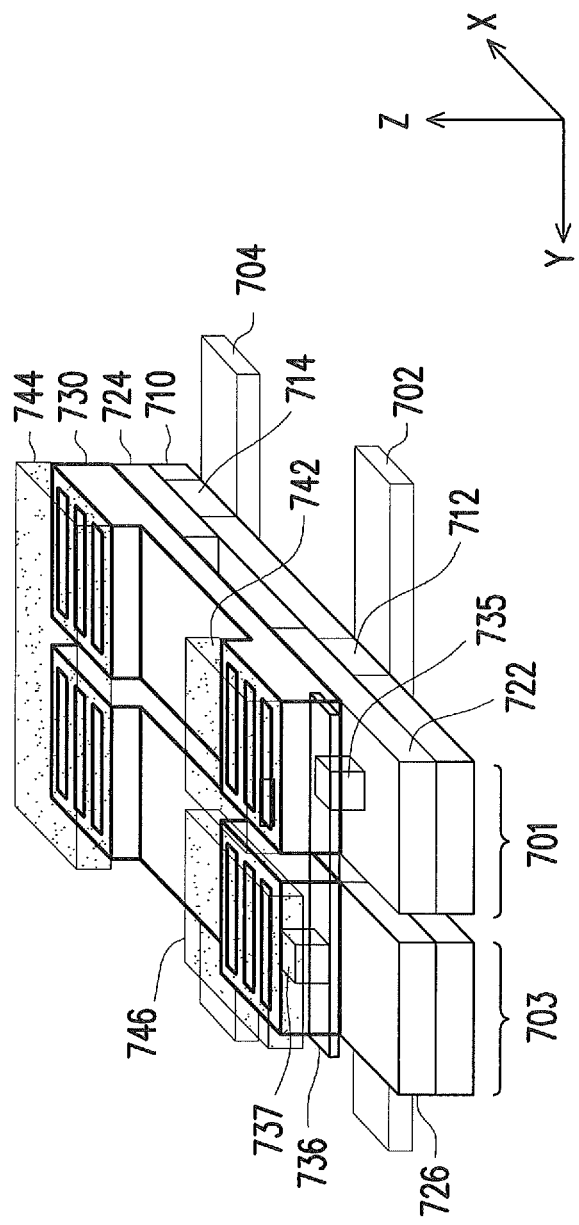
FIG. 7A illustrates a perspective view of two adjacent unit cells with another connection structure, in accordance with some embodiments of the present disclosure.

FIG. 7A illustrates a perspective view of a device 700-1 including two adjacent unit cells with another connection structure, in accordance with some embodiments of the present disclosure. As shown in FIG. 7A, the device 700-1 includes two adjacent unit cells 701, 703 formed on metal lines 702, 704 at the back side of the device 700-1. The unit cell 701 includes: source pads 722, 724 formed on a dielectric layer 710; a gate pad 730 on the source pads 722, 724; and drain pads 742, 744 formed on the gate pad 730. While the unit cell 703 has a similar structure to that of the unit cell 701, both the unit cell 701 and the unit cell 703 are provided with power supplies via the metal lines 702, 704 at the back side. For example, the unit cell 701 and the unit cell 703 are provided with a negative power supply (VSS) from the metal line 702 at the back side through a via 712 in the dielectric layer 710; and provided with a positive power supply (VDD) from the metal line 704 at the back side through a via 714 in the dielectric layer 710. Alternatively, the unit cell 701 and the unit cell 703 are provided with a negative power supply (VSS) from the metal line 704 at the back side through the via 714 in the dielectric layer 710; and provided with a positive power supply (VDD) from the metal line 702 at the back side through the via 712 in the dielectric layer 710.

Figure 7B:
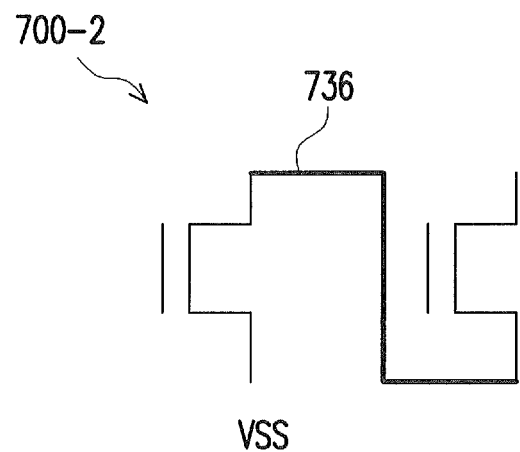
FIG. 7B illustrates a circuit diagram and a top view of the connection structure in FIG. 7A, in accordance with some embodiments of the present disclosure.
Figure 7B:
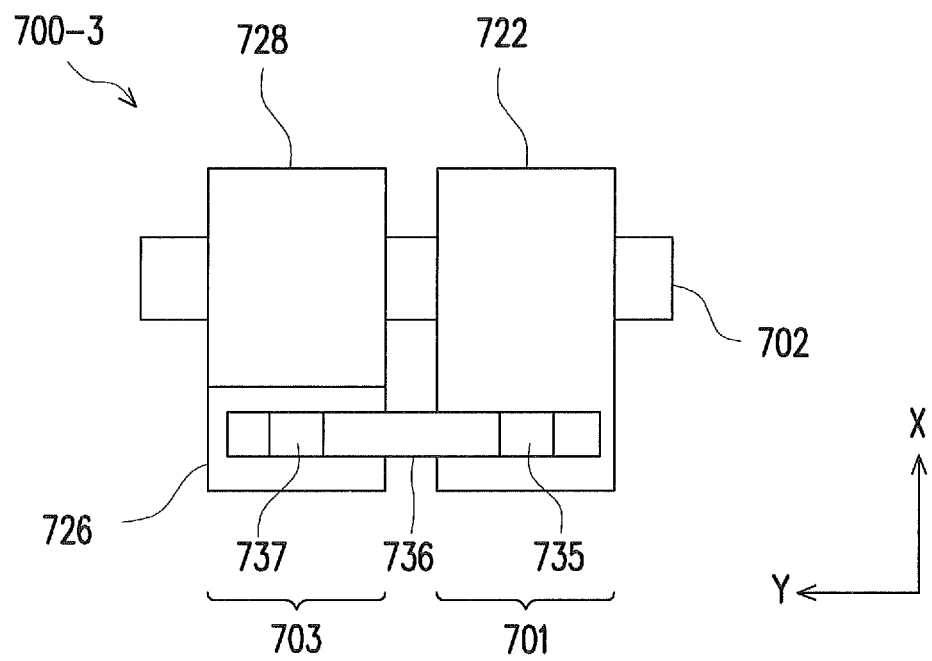

As shown in FIG. 7A, the device 700-1 further includes an inner metal 736 electrically connected between the drain pad 746 of the unit cell 703 and the source pad 722 of the unit cell 701, through a via 735 under the inner metal 736 and a via 737 on the inner metal 736. This inner metal 736, together with the vias 735, 737, connects two transistors of the two adjacent unit cells 701, 703 respectively in series, as illustrated in a circuit diagram 700-2 of FIG. 7B corresponding to the connection structure 736 in FIG. 7A. While the inner metal 736 is located over the source pad 722 in the unit cell 701, the inner metal 736 is located over a dielectric portion 726 in the unit cell 703. As shown in a top view 700-3 of the connection structure 736 in FIG. 7B, the dielectric portion 726 is beside the source pad 728 in the unit cell 703.

Figure 8A:
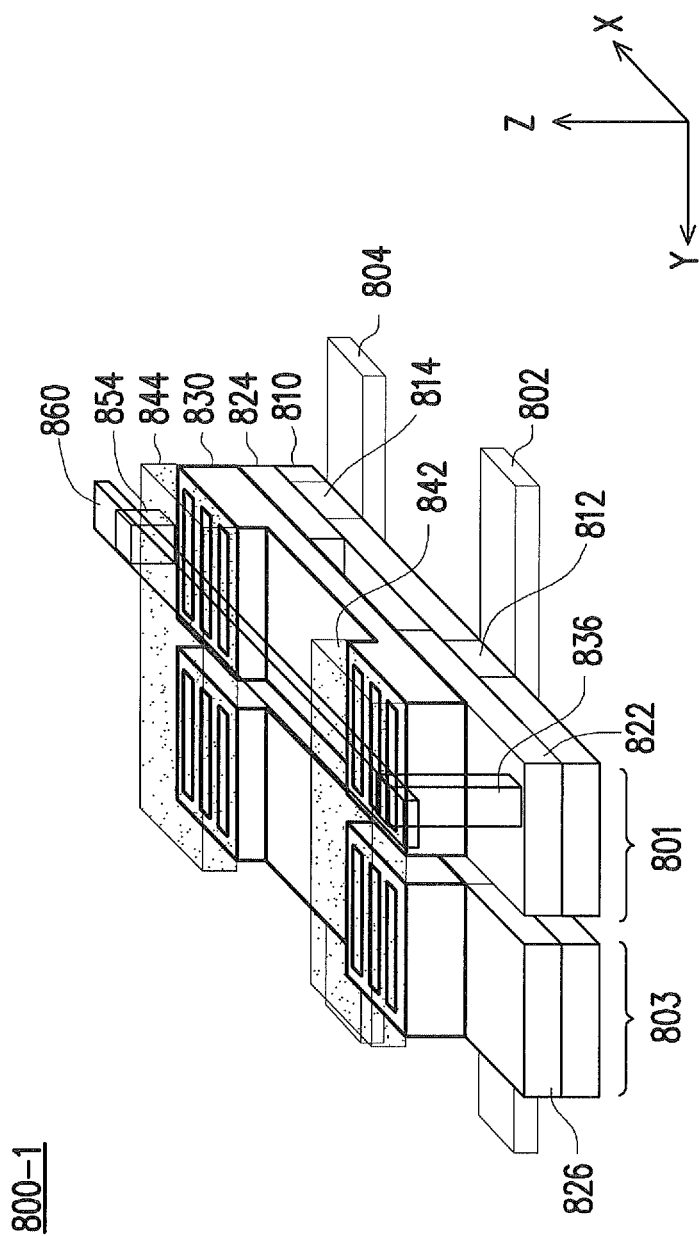
FIG. 8A illustrates a perspective view of two adjacent unit cells with yet another connection structure, in accordance with some embodiments of the present disclosure.

FIG. 8A illustrates a perspective view of a device 800-1 including two adjacent unit cells with yet another connection structure, in accordance with some embodiments of the present disclosure. As shown in FIG. 8A, the device 800-1 includes two adjacent unit cells 801, 803 formed on metal lines 802, 804 at the back side of the device 800-1. The unit cell 801 includes: source pads 822, 824 formed on a dielectric layer 810; a gate pad 830 on the source pads 822, 824; and drain pads 842, 844 formed on the gate pad 830. While the unit cell 803 has a similar structure to that of the unit cell 801, both the unit cell 801 and the unit cell 803 are provided with power supplies via the metal lines 802, 804 at the back side. For example, the unit cell 801 and the unit cell 803 are provided with a negative power supply (VSS) from the metal line 802 at the back side through a via 812 in the dielectric layer 810; and provided with a positive power supply (VDD) from the metal line 804 at the back side through a via 814 in the dielectric layer 810. Alternatively, the unit cell 801 and the unit cell 803 are provided with a negative power supply (VSS) from the metal line 804 at the back side through the via 814 in the dielectric layer 810; and provided with a positive power supply (VDD) from the metal line 802 at the back side through the via 812 in the dielectric layer 810.

Figure 8B:
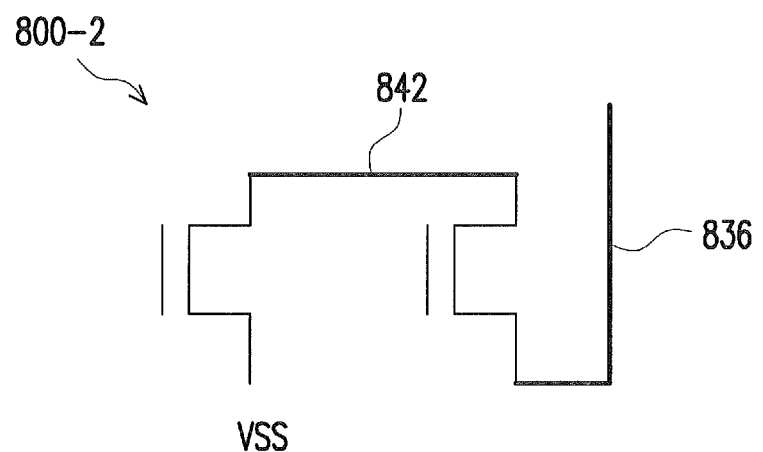
FIG. 8B illustrates a circuit diagram and a top view of the connection structure in FIG. 8A, in accordance with some embodiments of the present disclosure.
Figure 8B:
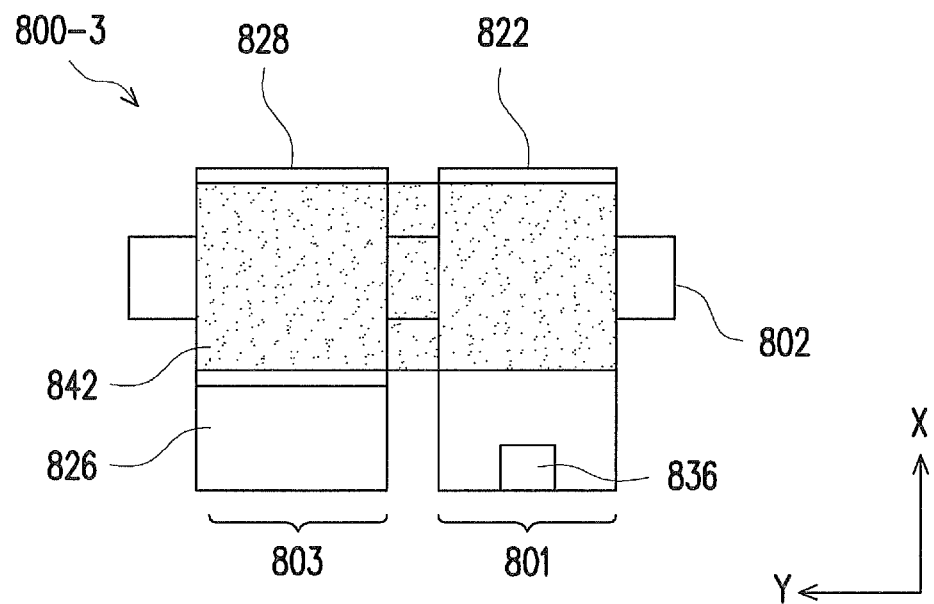

As shown in FIG. 8A, the drain pad 842 is a common drain pad shared by the two adjacent cells 801, 803 in this example. In some embodiments, the drain pad 844 is a common drain pad shared by the two adjacent cells 801, 803 as well. In addition, the device 800-1 further includes a via 836 physically coupled between the source pad 822 of the unit cell 801 and a metal line 860 at a front side of the unit cell 801; and includes a via 854 physically coupled between the drain pad 844 and the metal line 860 at the front side of the unit cell 801. The common drain pad 842 connects two transistors of the two adjacent unit cells 801, 803 respectively in series, as illustrated in a circuit diagram 800-2 of FIG. 8B corresponding to the connection structure in FIG. 8A. While the via 836 is located on the source pad 822 in the unit cell 801, no via is located over a dielectric portion 826 in the unit cell 703 in this example. As shown in a top view 800-3 of the connection structure 836 in FIG. 8B, the dielectric portion 826 is beside the source pad 828 in the unit cell 803; and the common drain pad 842 is located over the source pad 822 in the unit cell 801 and the source pad 828 in the unit cell 803. In some embodiments, each of the connection structures 636, 736, 836 may comprise a same material as that in the source pad and/or the drain pad connected by the connection structure.

Figure 9:
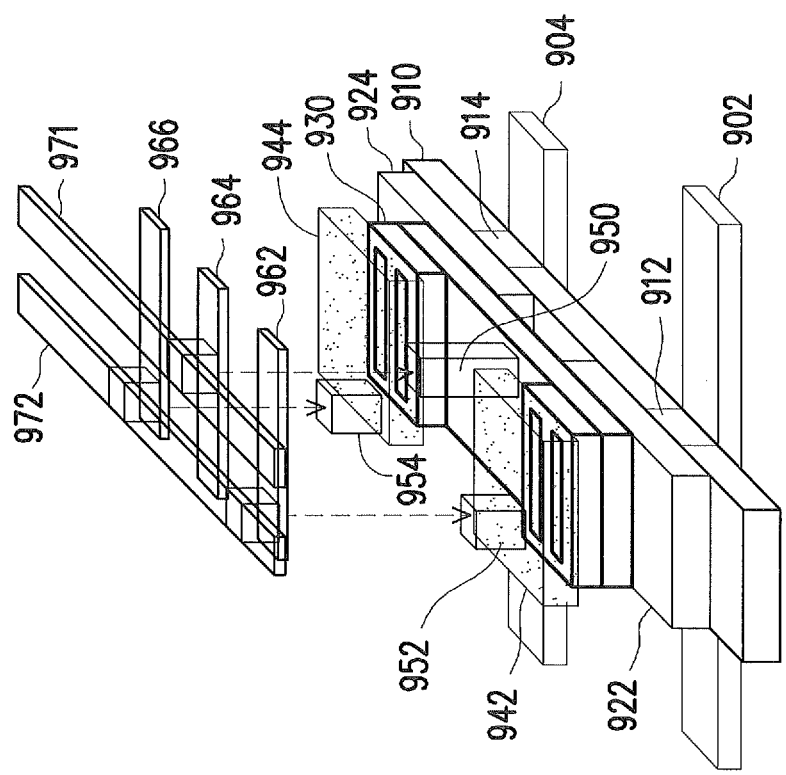
FIG. 9 illustrates a perspective view of an exemplary semiconductor device including a single unit cell, in accordance with some embodiments of the present disclosure.

FIG. 9 illustrates a perspective view of an exemplary semiconductor device 900 including a single unit cell, in accordance with some embodiments of the present disclosure. In some embodiments, the semiconductor device 900 in FIG. 9 is an inverter that includes: source pads 922, 924 formed on a dielectric layer 910; a gate pad 930 on the source pads 922, 924; and drain pads 942, 944 formed on the gate pad 930. The source pad 922 is provided with a positive power supply (VDD) by being electrically connected to a metal line 902 at the back side through a via 912 in the dielectric layer 910; and the source pad 924 is provided with a negative power supply (VSS) by being electrically connected to a metal line 904 at the back side through a via 914 in the dielectric layer 910. Alternatively, the source pad 922 is provided with a VSS by being electrically connected to a metal line 902 at the back side through a via 912 in the dielectric layer 910; and the source pad 924 is provided with a VDD by being electrically connected to a metal line 904 at the back side through a via 914 in the dielectric layer 910.

As shown in FIG. 9, the semiconductor device 900 further includes drain contacts 952, 954 on the drain pads 942, 944 respectively, and includes a gate contact 950 on the gate pad 930. In this example, three M0 lines 962, 966, 964 at the front side are disposed on the drain contacts 952, 954 and the gate contact 950 respectively, to provide front side routing. In addition, two M1 lines 971, 972 are disposed on the three M0 lines 962, 966, 964. In some embodiments, the M1 line 971 is electrically connected to the M0 line 964 to serve as an input pin of the inverter 900; and the M1 line 972 is electrically connected to the M0 lines 962, 966 to serve as an output pin of the inverter 900.

Figure 10:
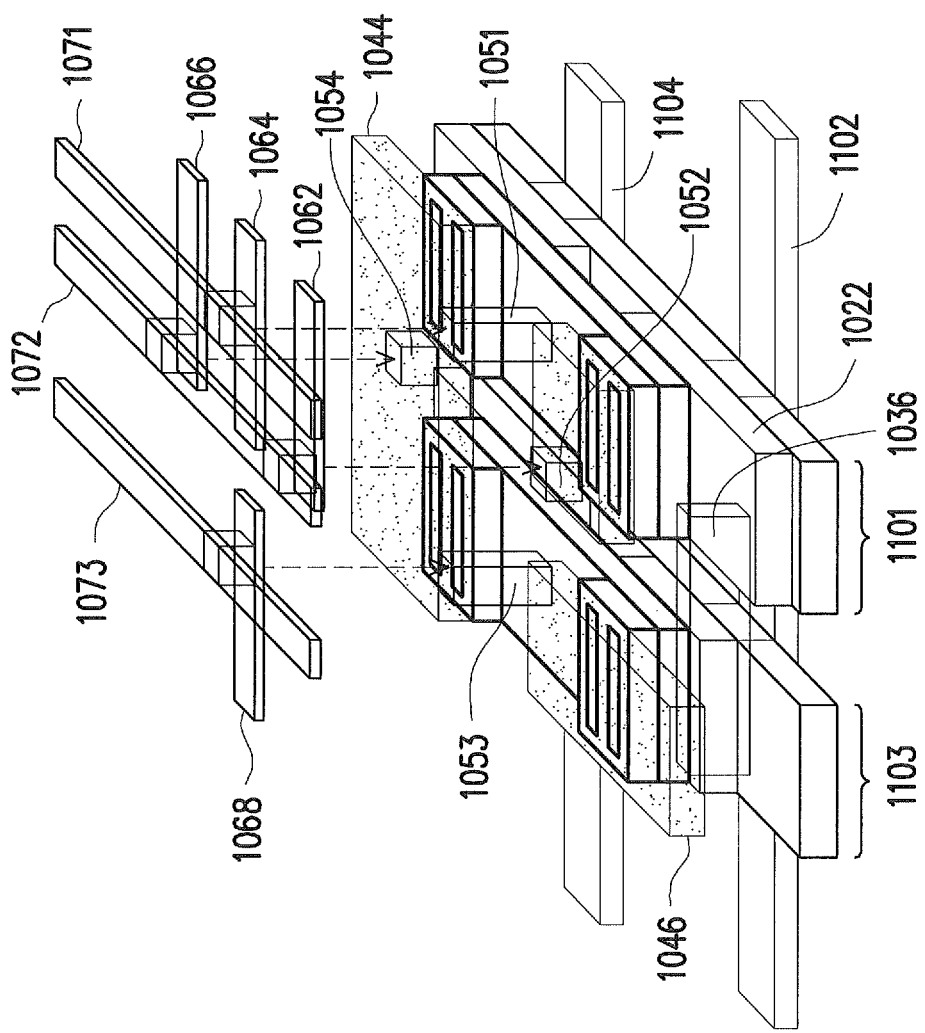
FIG. 10 illustrates a perspective view of an exemplary semiconductor device including two unit cells, in accordance with some embodiments of the present disclosure.

FIG. 10 illustrates a perspective view of an exemplary semiconductor device 1000 including two unit cells, in accordance with some embodiments of the present disclosure. In some embodiments, the semiconductor device 1000 in FIG. 10 is a two-input NAND that includes two adjacent cells 1001, 1003 that are connected by at least one connection structure each of which is disposed between the two adjacent cells 1001, 1003. As shown in FIG. 10, while each of the two adjacent cells 1001, 1003 has a structure similar to that of a unit cell shown in FIGS. 1-9, each of the source contacts of the two adjacent cells 1001, 1003 is electrically connected to a power supply through one of the metal lines 1002, 1004 disposed at a back side of the cells. In some embodiments, the at least one connection structure comprises a via 1036 coupled between the drain pad 1046 of the cell 1003 and the source pad 1022 of the cell 1001. In some embodiments, the at least one connection structure comprises a common drain pad 1044 shared by the two respective transistors of the two adjacent cells 1001, 1003.

As shown in FIG. 10, the semiconductor device 1000 further includes drain contacts 1052, 1054, and gate contacts 1051, 1053. In this example, four M0 lines 1062, 1066, 1064, 1068 at the front side are disposed on the drain contacts 1052, 1054 and the gate contacts 1051, 1053 respectively, to provide front side routing. In addition, three M1 lines 1071, 1072, 1073 are disposed on the three M0 lines 1062, 1066, 1064, 1068. In some embodiments, the M1 line 1071 is electrically connected to the M0 line 1064 to serve as a first input pin of the two-input NAND 1000; the M1 line 1073 is electrically connected to the M0 line 1068 to serve as a second input pin of the two-input NAND 1000; and the M1 line 1072 is electrically connected to the M0 lines 1062, 1066 to serve as an output pin of the two-input NAND 1000.

Figure 11:
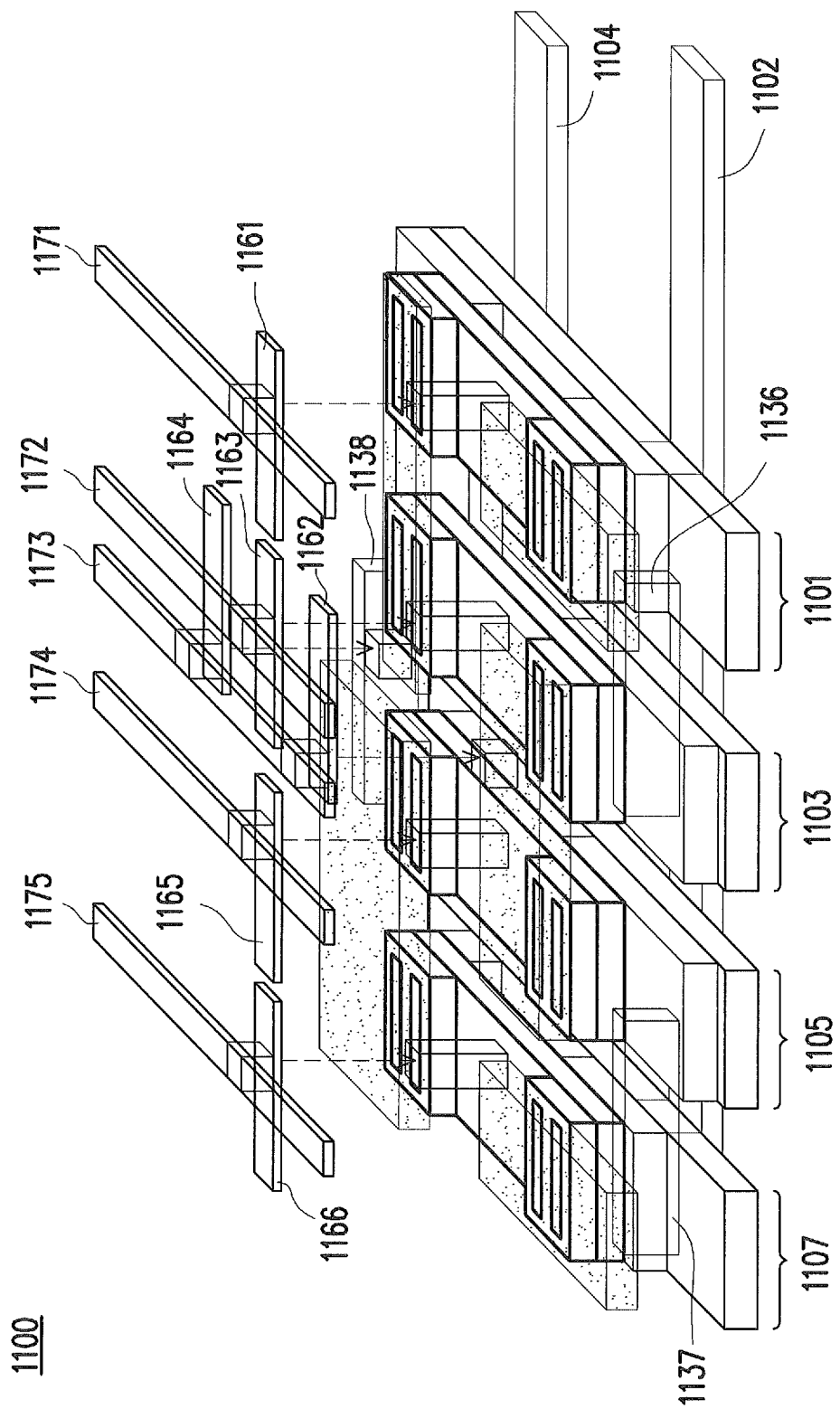
FIG. 11 illustrates a perspective view of an exemplary semiconductor device including four unit cells, in accordance with some embodiments of the present disclosure.

FIG. 11 illustrates a perspective view of an exemplary semiconductor device 1100 including four unit cells, in accordance with some embodiments of the present disclosure. In some embodiments, the semiconductor device 1100 in FIG. 11 is a four-input semiconductor device that includes four adjacent or consecutive cells 1101, 1103, 1105, 1107 that are connected by at least one connection structure each of which is disposed between two adjacent cells of the four cells 1101, 1103, 1105, 1107. As shown in FIG. 11, while each of the four cells 1101, 1103, 1105, 1107 has a structure similar to that of a unit cell shown in FIGS. 1-10, each of the source contacts of the four cells 1101, 1103, 1105, 1107 is electrically connected to a power supply through one of the metal lines 1102, 1104 disposed at a back side of the cells. In some embodiments, the at least one connection structure comprises: a via 1136 coupled between a drain pad of the cell 1101 and a source pad of the cell 1103; a via 1137 coupled between a drain pad of the cell 1107 and a source pad of the cell 1105; and a via 1138 coupled between a drain pad of the cell 1105 and a source pad of the cell 1103.

As shown in FIG. 11, in this example, six M0 lines 1161, 1162, 1163, 1164, 1165, 1166 at the front side are disposed on the drain contacts and gate contacts of the four cells 1101, 1103, 1105, 1107, to provide front side routing. In addition, five M1 lines 1171, 1172, 1173, 1174, 1175 are disposed on the six M0 lines 1161, 1162, 1163, 1164, 1165, 1166. In some embodiments, the M1 line 1171 is electrically connected to the M0 line 1161 to serve as a first input pin of the four-input device 1100; the M1 line 1172 is electrically connected to the M0 line 1163 to serve as a second input pin of the four-input device 1100; the M1 line 1174 is electrically connected to the M0 line 1165 to serve as a third input pin of the four-input device 1100; the M1 line 1175 is electrically connected to the M0 line 1166 to serve as a fourth input pin of the four-input device 1100; and the M1 line 1173 is electrically connected to the M0 lines 1162, 1164 to serve as an output pin of the four-input device 1100.

Figure 12:
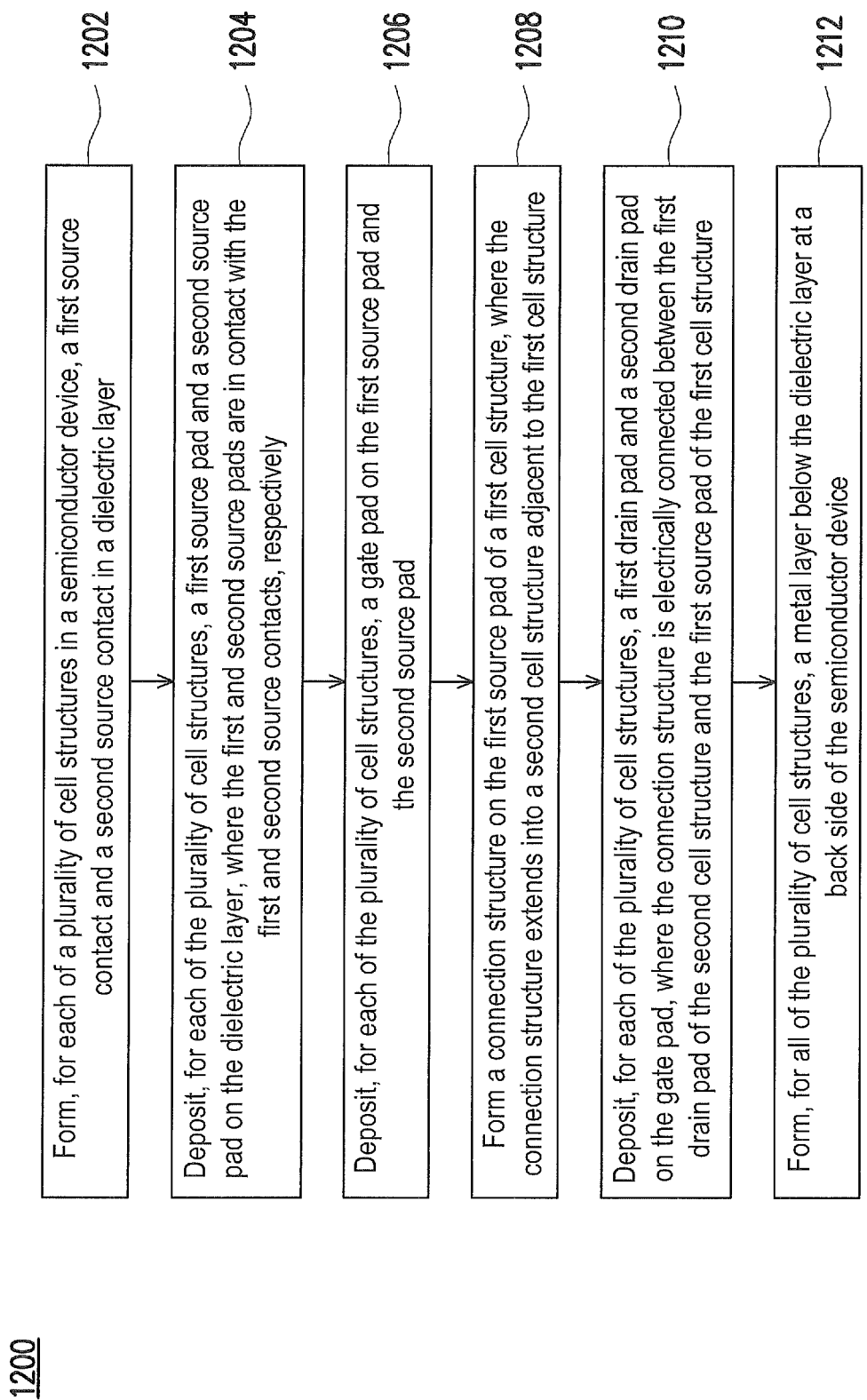
FIG. 12 shows a flow chart illustrating an exemplary method for forming a semiconductor device including a plurality of cell structures, in accordance with some embodiments of the present disclosure.

FIG. 12 shows a flow chart illustrating an exemplary method 1200 for forming a semiconductor device including a plurality of cell structures, in accordance with some embodiments of the present disclosure. In some embodiments, the semiconductor device may be any device described in FIGS. 1-11. At operation 1202, for each of the plurality of cell structures in the semiconductor device, a first source contact and a second source contact are formed in a dielectric layer. At operation 1204, for each of the plurality of cell structures, a first source pad and a second source pad are deposited on the dielectric layer, where the first and second source pads are in contact with the first and second source contacts, respectively. At operation 1206, for each of the plurality of cell structures, a gate pad is deposited on the first source pad and the second source pad. At operation 1208, a connection structure is formed on the first source pad of a first cell structure, where the connection structure extends into a second cell structure adjacent to the first cell structure. At operation 1210, for each of the plurality of cell structures, a first drain pad and a second drain pad are deposited on the gate pad, where the connection structure is electrically connected between the first drain pad of the second cell structure and the first source pad of the first cell structure.

Optionally at operation 1212, for all of the plurality of cell structures, a metal layer is formed below the dielectric layer at a back side of the semiconductor device. In some embodiments, the metal layer comprises a first metal line electrically connected to a negative power supply and a second metal line electrically connected to a positive power supply. All of the first source contacts of the plurality of cell structures may be electrically connected to the first metal line; and all of the second source contacts of the plurality of cell structures may be electrically connected to the second metal line. The order of the operations shown in FIG. 12 may be changed according to different embodiments of the present disclosure.

In an embodiment, a semiconductor structure is disclosed. The semiconductor structure includes: a gate structure including a gate pad and a gate contact on the gate pad; a first source region disposed below the gate pad; a first drain region disposed on the gate pad, wherein the first source region, the first drain region and the gate structure form a first transistor; a second source region disposed below the gate pad; a second drain region disposed on the gate pad, wherein the second source region, the second drain region and the gate structure form a second transistor; and at least one metal line that is below the first source region and the second source region, and is electrically connected to at least one power supply.

In another embodiment, a semiconductor device is disclosed. The semiconductor device includes: a plurality of cell structures and at least one connection structure each of which is disposed between two adjacent cell structures of the plurality of cell structures. Each of the plurality of cell structures comprises: a gate structure including a gate pad and a gate contact on the gate pad, a first source region disposed below the gate pad, a first drain region disposed on the gate pad, a second source region disposed below the gate pad, and a second drain region disposed on the gate pad.

In yet another embodiment, a method for forming a semiconductor device including a plurality of cell structures is disclosed. The method includes: forming, for each of the plurality of cell structures, a first source contact and a second source contact in a dielectric layer; depositing, for each of the plurality of cell structures, a first source pad and a second source pad on the dielectric layer, wherein the first source pad and the second source pad are in contact with the first source contact and the second source contact, respectively; depositing, for each of the plurality of cell structures, a gate pad on the first source pad and the second source pad; forming a connection structure on the first source pad of a first cell structure, wherein the connection structure extends into a second cell structure adjacent to the first cell structure; and depositing, for each of the plurality of cell structures, a first drain pad and a second drain pad on the gate pad, wherein the connection structure is electrically connected between the first drain pad of the second cell structure and the first source pad of the first cell structure.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a gate structure including a gate pad and a gate contact on the gate pad;
a first source region disposed below the gate pad, wherein the first source region comprises a first source pad;
a first drain region disposed on the gate pad, wherein the first drain region comprises a first drain pad, and wherein the first source region, the first drain region and the gate structure form a first transistor;
a second source region disposed below the gate pad, wherein the second source region comprises a second source pad;
a second drain region disposed on the gate pad, wherein the second drain region comprises a second drain pad, and wherein the second source region, the second drain region and the gate structure form a second transistor; and
at least one metal line that is below the first source region and the second source region, and is electrically connected to at least one power supply;
a plurality of first vias formed through the gate pad and connecting the first drain pad with the first source pad; and
a plurality of second vias formed through the gate pad and connecting the second drain pad with the second source pad.

2. The semiconductor structure of claim 1, wherein:
the first transistor is a metal-oxide-semiconductor field-effect transistor (MOSFET) of a first type;
the second transistor is a MOSFET of a second type; and
the first type and the second type are opposite types.

3. The semiconductor structure of claim 1, wherein:
the first drain region further comprises a first drain contact on the first drain pad;
the second drain region further comprises a second drain contact on the second drain pad; and
each of the gate contact, the first drain contact and the second drain contact, is electrically connected to one of a plurality of first metal lines disposed over the gate structure.

4. The semiconductor structure of claim 1, wherein:
the first source region further comprises a first source contact below the first source pad;
the second source region further comprises a second source contact below the second source pad; and
each of the first source contact and the second source contact is electrically connected to one of a plurality of second metal lines in a metal layer disposed below the gate structure.

5. The semiconductor structure of claim 4, wherein the first source contact and the second source contact are formed in a dielectric layer on the metal layer.

6. The semiconductor structure of claim 5, wherein:
the first source pad and the second source pad are formed in a source pad layer on the dielectric layer; and
the source pad layer includes a shallow trench isolation (STI) between the first source pad and the second source pad.

7. The semiconductor structure of claim 4, wherein:
one of the first source contact and the second source contact is electrically connected to a positive power supply through one of the plurality of second metal lines below the gate structure; and
the other one of the first source contact and the second source contact is electrically connected to a negative power supply through one of the plurality of second metal lines below the gate structure.

8. The semiconductor structure of claim 4, wherein:
the plurality of first metal lines comprise metal 0 lines at a front side of a unit cell;
the plurality of second metal lines comprise metal 0 lines at a back side of the unit cell; and
the plurality of second metal lines are formed in parallel with the plurality of first metal lines.

9. The semiconductor structure of claim 4, wherein:
the plurality of first metal lines comprise metal 0 lines at a front side of a unit cell; the plurality of second metal lines comprise metal 0 lines at a back side of the unit cell; and
the plurality of second metal lines are formed perpendicular to the plurality of first metal lines.

10. A semiconductor device, comprising:
a plurality of cell structures, wherein each of the plurality of cell structures comprises:
a gate structure including a gate pad and a gate contact on the gate pad,
a first source region disposed below the gate pad, wherein the first source region comprises a first source pad and a first source contact below the first source pad;
a first drain region disposed on the gate pad, wherein the first drain region comprises a first drain pad and a first drain contact on the first drain pad;
a second source region disposed below the gate pad, wherein the second source region comprises a second source pad and a second source contact below the second source pad; and
a second drain region disposed on the gate pad, wherein the second drain region comprises a second drain pad and a second drain contact on the second drain pad; and
at least one connection structure each of which is disposed between two adjacent cell structures of the plurality of cell structures,
wherein all of the first source contacts of the plurality of cell structures are electrically connected to a first power supply through a first metal line disposed at a back side of the semiconductor device, and wherein all of the second source contacts of the plurality of cell structures are electrically connected to a second power supply through a second metal line disposed at the back side of the semiconductor device.

11. The semiconductor device of claim 10, wherein:
the first source region, the first drain region and the gate structure form a first transistor of a first type; and
the second source region, the second drain region and the gate structure form a second transistor of a second type; and
the first type and the second type are different types.

12. The semiconductor device of claim 10,
wherein the at least one connection structure comprises a via physically coupled between the first drain pad of one of the two adjacent cell structures and the first source pad of the other one of the two adjacent cell structures.

13. The semiconductor device of claim 10,
wherein the at least one connection structure comprises an inner metal electrically connected between the first drain pad of one of the two adjacent cell structures and the first source pad of the other one of the two adjacent cell structures, through two vias on and below the inner metal respectively.

14. The semiconductor device of claim 10, wherein the at least one connection structure comprises
a common drain pad shared by the two adjacent cell structures, and a via physically coupled between the first source pad of one of the two adjacent cell structures and a metal line at a front side of the semiconductor device.

15. The semiconductor device of claim 10, further comprising:
a first metal layer including a plurality of metal 0 lines formed on the gate contact, the first drain contact and the second drain contact; and
a second metal layer including a plurality of metal 1 lines formed on the first metal layer, wherein:
each of the plurality of metal 0 lines extends along a first direction,
each of the plurality of metal 1 lines extends along a second direction perpendicular to the first direction, and
each of the plurality of cell structures has a first length along the first direction and a second length along the second direction.

16. The semiconductor device of claim 15, wherein:
the second length is 3 to 5.5 times a first metal pitch of the first metal layer; and the first length is 2 to 3 times a second metal pitch of the second metal layer.

17. The semiconductor device of claim 15, wherein:
the second length is 2 to 3 times a first metal pitch of the first metal layer; and the first length is 3 to 5 times a second metal pitch of the second metal layer.

18. A semiconductor device, comprising:
a plurality of cell structures, wherein each of the plurality of cell structures comprises:
a gate structure including a gate pad and a gate contact on the gate pad,
a first source region disposed below the gate pad, wherein the first source region comprises a first source pad and a first source contact below the first source pad;
a first drain region disposed on the gate pad, wherein the first drain region comprises a first drain pad and a first drain contact on the first drain pad;
a second source region disposed below the gate pad, wherein the second source region comprises a second source pad and a second source contact below the second source pad; and
a second drain region disposed on the gate pad, wherein the second drain region comprises a second drain pad and a second drain contact on the second drain pad;
at least one connection structure each of which is disposed between two adjacent cell structures of the plurality of cell structures;
a first metal layer including a plurality of metal 0 lines formed on the gate contact, the first drain contact and the second drain contact; and
a second metal layer including a plurality of metal 1 lines formed on the first metal layer, wherein:
each of the plurality of metal 0 lines extends along a first direction,
each of the plurality of metal 1 lines extends along a second direction perpendicular to the first direction, and
each of the plurality of cell structures has a first length along the first direction and a second length along the second direction.

19. The semiconductor device of claim 18, wherein:
the first source region, the first drain region and the gate structure form a first transistor of a first type;
the second source region, the second drain region and the gate structure form a second transistor of a second type; and
the first type and the second type are different types.

20. The semiconductor device of claim 18, wherein:
all of the first source contacts of the plurality of cell structures are electrically connected to a first power supply through a first metal line disposed at a back side of the semiconductor device, and
all of the second source contacts of the plurality of cell structures are electrically connected to a second power supply through a second metal line disposed at the back side of the semiconductor device.

* * * * *